United States Patent [19]

Pan

[11] Patent Number: 5,236,551
[45] Date of Patent: Aug. 17, 1993

[54] BEWORK OF POLYMERIC DIELECTRIC ELECTRICAL INTERCONNECT BY LASER PHOTOABLATION

[75] Inventor: Ju-Don T. Pan, Saratoga, Calif.

[73] Assignee: Microelectronics and Computer Technology Corporation, Austin, Tex.

[21] Appl. No.: 972,665

[22] Filed: Nov. 6, 1992

Related U.S. Application Data

[63] Continuation-in-part of Ser. No. 822,257, Jan. 17, 1992, abandoned, which is a continuation of Ser. No. 521,790, May 10, 1990, abandoned.

[51] Int. Cl.$^5$ .................. H01L 21/306; H01L 21/26
[52] U.S. Cl. .................. 156/643; 156/644; 437/173
[58] Field of Search .................. 437/173; 156/643, 644

[56] References Cited

U.S. PATENT DOCUMENTS

| | | | |
|---|---|---|---|
| 4,599,136 | 7/1986 | Avaps | 204/192.22 |
| 4,602,420 | 7/1986 | Saito | 437/173 |
| 4,622,058 | 11/1986 | Leavy-Renick et al. | 156/644 |
| 4,795,720 | 1/1989 | Kawanabe et al. | 437/173 |
| 4,897,153 | 1/1990 | Cole | 156/643 |
| 4,965,702 | 10/1990 | Lott et al. | 361/401 |

FOREIGN PATENT DOCUMENTS 272799 6/1988 European Pat. Off. ............ 437/173

OTHER PUBLICATIONS

D. B. Tuckerman et al., "Laser Planarization", Solid State Technology, Apr. 1986, pp. 129–134.
IBM Technical Disclosure Bulletin, vol. 27, No. 10A, Mar. 1985, pp. 5764–5765, "Wet Etching for Line Deletion and Short Repair on Ceramic Substrates".

Primary Examiner—Brian E. Hearn
Assistant Examiner—Linda J. Fleck
Attorney, Agent, or Firm—David M. Sigmond

[57] ABSTRACT

A metal/polymeric dielectric substrate has metal conductors selectively disconnected by photoablating the polymeric dielectric with an excimer laser, etching the exposed metal using the polymeric dielectric as a mask, and coating an additional layer of polymeric dielectric. This eliminates the need for depositing and removing a separate photoablatable mask. Siloxane-modified-polyimide is a preferred photoablatable polymeric material and copper is a preferred metal.

23 Claims, 2 Drawing Sheets

BEWORK OF POLYMERIC DIELECTRIC ELECTRICAL INTERCONNECT BY LASER PHOTOABLATION

CROSS-REFERENCE TO RELATED APPLICATIONS

This is a continuation-in-part of U.S. Ser. No. 07/822,257 filed Jan. 17, 1992 now abandoned; which is a continuation of U.S. Ser. No. 07/521,790 filed May 10, 1990 now abandoned.

BACKGROUND OF THE INVENTION

The present invention is directed to a method of disconnecting metallization in a polymeric dielectric electrical interconnect, such as a substrate or printed circuit board, and more particularly to reworking short-circuited connections or customization severing of connections between copper lines in high density copper/polyimide substrates.

Advances in integrated circuit miniaturization have led to high density electrical interconnection networks that accommodate high density packaging. A polymeric material layer, such as a polyimide layer, can be formed over an electrically conductive metallization pattern in sufficient thickness to act as a dielectric layer. Copper is a preferred electrical conductor with polyimide, and can be fabricated with densities of over 500 lines per inch per level. Copper/polyimide interconnects can be fabricated with either stacked or staggered vias, and can be in a predetermined circuit pattern or customizable. Good design practice requires getting the necessary interconnect in a minimum area for very short signal delays between chips, and in a minimum number of layers to reduce the cost and manufacturing complexity.

There is a need to disconnect the electrically conductive metallization in polyimide interconnects in a simple and convenient manner. This need may arise due to undesired short-circuits between adjacent metallization lines, or due to a customization process which tailors the metallization routing to a specific application.

Conventionally, the patterned etching of thin metallization is accomplished by the use of photolithographic masks, in which an etchant-resistant coating (resist) is laid down upon a substrate and selectively developed and removed. The disadvantages of organic resists are well known, such as contamination from organic solvents and degradation at temperatures over 200° C.

To overcome these difficulties numerous maskless techniques have been developed. U.S. Pat. No. 4,619,894 describes patterning an aluminum oxide layer on a substrate by selective heating. U.S. Pat. No. 4,615,904 describes forming a thin absorptive layer on a substrate, prenucleating portions of the absorptive layer with a laser, and depositing material on the prenucleated portions. U.S. Pat. No. 4,622,095 describes exposing a metallized substrate to a laser in a halogen gas atmosphere to form a metal halide salt reaction product on the substrate.

The use of an excimer laser to remove selected regions of a resist by way of photoablation in order to pattern the underlying layer is known in the art. It is termed "ablative photodecomposition" (APD) and requires high powered pulsed sources. U.S. Pat. No. 4,414,059 describes an APD process wherein ultraviolet radiation of wavelengths less than 220 nm cause fragmentation of resist polymer chains and the immediate escape of the fragmented portions from the resist layer. In effect, the incident energy is transferred to kinetic energy in rapid and large amounts of bond breaking whereby the polymer chains are fragmented and explode-off and escape as volatile by-products. No subsequent development step is required for patterning the resist layer. The '059 patent, however, is restricted to the use of a resist layer for lithography in which after the lithography is finished, the photoablated resist layer is completely removed and the device fabrication procedure continues.

Likewise, U.S. Pat. No. 4,568,409 describes a process for precision separation of layers, in which the layer to be separated is coated with a functional material that is selectively removed by spectral energy to form a mask which is resistive to an etchant chosen to etch underlying material. The '409 patent also teaches the removal of the functional material after etching by dissolution in a suitable solvent.

Another APD technique is described in U.S. Pat. No. 4,780,177 wherein a thin layer of photoablative polymer disposed on a metal layer is covered with a thick transparent material. A beam of laser energy is directed through the upper layer and is absorbed by the lower layer. The ablated lower layer also blows off the thick transparent upper layer resulting in higher etch resolution capability.

The use of ultraviolet radiation for etching polyimide is also known in the art. U.S. Pat. No. 4,508,749 describes the use of a U.V. source between 240–400 nm to etch through a polyimide layer. The '749 patent is primarily directed to producing tapered openings in the polyimide structure between metallization layers so that metallization can then be deposited in the openings to connect metallic layers adjacent to the top and bottom surfaces of the polyimide.

Another approach is described in U.S. Pat. No. 4,684,437 in which a polymer/metal structure is irradiated in order to remove one material without harming another. Laser wavelength and energy fluence per pulse are selected so that the removal rate of the metal due to thermal processes is significantly greater than the removal rate of the polymer by APD.

SUMMARY OF THE INVENTION

The present invention is directed at an improved method of disconnecting interconnecting metallization in polymeric electrical interconnects by way of photoablation.

The present invention makes use of the polymeric dielectric layer, such as polyimide, as a photoablative etch mask, thereby removing the need for coating and stripping a separate photoablative mask as taught by the prior art.

Accordingly, it is a primary object of present invention to provide a photoablative etching process that eliminates several processing steps when polymeric dielectric interconnect metallization needs to be disconnected, as is the case when a short-circuit is detected or customization severing is required.

Another object of the present invention is a method in which a first thin layer of photoabsorptive polymeric dielectric is disposed on and in contact with a metallization layer on a substrate, a laser beam is directed at the first polymeric dielectric layer so as to ablate the polymeric dielectric in the irradiated areas thereby exposing the underlying metallization, an etchant is applied to disconnect the exposed metallization while leaving the remaining metallization and polymeric dielectric intact, and a second polymeric dielectric layer is coated onto the first polymeric dielectric layer and the disconnected metallization.

Still another object of the present invention is wherein the disconnected metallization, first polymeric dielectric layer and the second polymeric dielectric layer form a composite wiring layer which covers the entire top surface of a planar substrate.

A further object of the present invention is wherein the metallization is selected from the group consisting of copper, aluminum, gold and tungsten.

Yet a further object of the present invention is wherein a layer of polymeric dielectric is disposed between a base and the metallization.

A still further object of the present invention is wherein an excimer laser is used.

Still a further object of the present invention is wherein the first polymeric dielectric layer has a thickness of 1 $\mu$m to 10 $\mu$m.

A further object of the present invention is wherein the etch consists of a dry etch, or alternatively a wet chemical etch.

A still further object of the present invention is wherein the second polymeric dielectric layer is planarized.

Still a further object of the present invention is wherein the polymeric dielectric is selected from the group consisting of siloxane-modified-polyimide, polyimide, benzocyclo-butane (BCB), and epoxy.

Yet a further object of the present invention is wherein a multilayer electrical interconnect structure is fabricated.

BRIEF DESCRIPTION OF THE DRAWINGS

A better understanding of the present invention can be obtained when the following detailed description of the preferred embodiment is read in conjunction with the following drawings, in which.

DETAILED DESCRIPTION OF THE PREFERRED EMBODIMENTS

Figure 1:
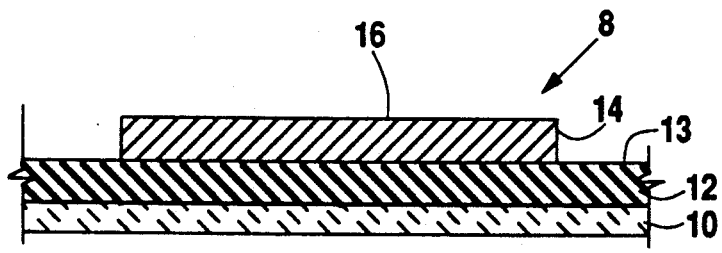
FIG. 1 is a cross-sectional view of interconnect metallization on a planar substrate.

Referring now to FIG. 1, an electrical interconnect structure such as a printed circuit board or substrate is generally shown as a substrate 8 with a planar top surface. Substrate 8 includes a base 10 of any suitable material, such as silicon, alumina ceramic, aluminum nitride, a metallic material, or glass ceramic. Preferably, though not essential to the present invention if base 10 is not an electrical conductor, an optional polymeric dielectric layer 12 having a thickness of 10 $\mu$m with a polished, planar top surface 13 can be disposed on base 10. An electrically conductive metallization 14 is disposed on portions of polymeric dielectric layer 12. Preferably conductor 14 is copper, although other suitable electrical conductors include aluminum, gold, and tungsten. Copper deposition methods, such as electroless deposition and electroplating, are well known in the art. A preferred thickness for copper conductor 14 is 1 $\mu$m to 10 $\mu$m. Optional polymeric dielectric layer 12 will be mandatory if base 10 is electrically conductive in order to prevent short-circuiting separate conductive metallizations 14.

Figure 2:
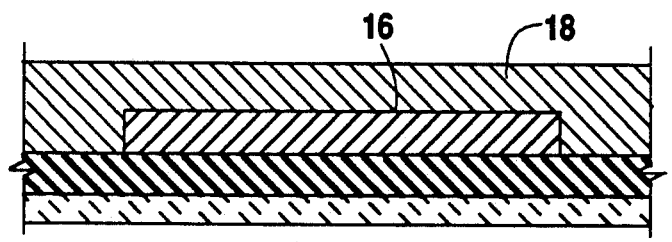
FIG. 2 is a cross-sectional view in which a first layer of polymeric dielectric is coated on the entire top surfaces of the metallization and the substrate regions not covered by the metallization.

Referring now to FIG. 2, a thin first layer of ablative photoabsorptive polymeric dielectric 18 is disposed on and in contact with the entire top surface 16 of conductor 14 as well as the entire top surface 13 of substrate 8 not covered by conductor 14. As a result, a first composite wiring layer comprising, more preferably consisting essentially of, and most preferably consisting of conductor 14 and polymeric dielectric layer 18 is formed on the entire top surface 13 of substrate 8. A preferred polymeric dielectric material is siloxane-modified-polyimide, although other suitable materials include polyimide, benzo-cyclo-butane (BCB), and epoxy. First polymeric dielectric layer 18 can be deposited by any suitable method, such as spin-coating, spraying or other coating methods. The type of curing, such as by a hot plate, oven, or infrared lamp, will not affect the response of the polymeric dielectric in the present invention. A preferred range of thickness for first polymeric dielectric layer 18 is 1 $\mu$m to 10 $\mu$m. First polymeric dielectric layer 18 can either be fully cured or partially cured to enhance its adhesion to a second polymeric dielectric layer to be described below.

Figure 3:
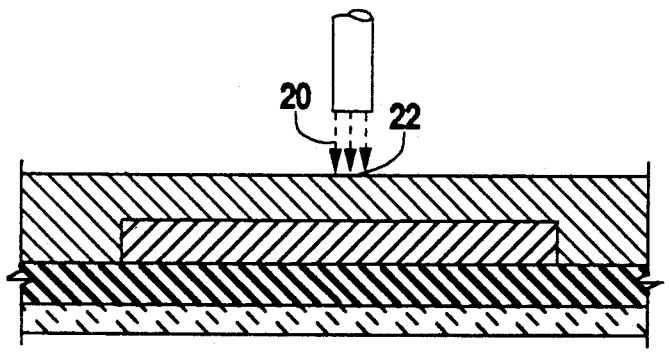
FIG. 3 is a cross-sectional view in which an excimer laser is applied to the first polymeric dielectric layer.

Referring now to FIG. 3, a beam of laser energy 20 is directed to region 22 on the exposed top surface of first polymeric dielectric layer 18. Laser beam 20 must exhibit suitable wavelength and sufficient power density so as to ablate first polymeric dielectric layer 18 in region 22. A preferred laser is an excimer laser.

The laser technique termed ablative photodecomposition (APD) does not totally rely on a thermal mechanism for etching polymeric materials. Instead, photochemical, thermal, and other effects are the contributing mechanisms by which polymeric materials are rapidly and cleanly etched without damage to surrounding layers of the same, or different materials. APD relies on the incidence of ultraviolet radiation having wavelengths less that 400 nm, and a sufficiently large energy fluence per pulse that the threshold for APD is overcome. Some commercially available lasers for this purpose include argon flouride excimer laser (193 nm), the krypton flouride excimer layer (248 nm), the xenon chloride excimer laser (308 nm), and the xenon flouride excimer laser (351 nm). Most polymer-type materials, such as polyimide, involve energy fluences per pulse roughly between about 10 mJ/cm² and 350 mJ/cm². Certain polymers, such as polyimide, absorb a very high percentage of this radiation in a very thin surface layer of the material, wherein the absorption of the radiation is confined to a very small volume of the material. The absorption occurs rapidly and produces material fragments which explode (i.e. ablate) from the surface, leaving a localized etched region. The concept of APD is further described by R. Srinvasan, *Journal of Vacuum Science Technology,* B1(4) p. 923 (October–December 1983); and R. Srinvasan et al, *Journal of Polymer Science: Polymer Chemistry Edition,* Vol. 22 pp. 2601-2609 (1974). APD laser parameters and systems for etching polyimide are known to those having skill in the art, as is described by G. D. Poulin, P. A. Eisele, H. B. G. Wong, and T. A. Znotins in "Use of Excimer Lasers in the Electronics Packaging Industry,' *Proceedings of the Technical Program, National Electronic Packaging and Production Conference,* pp. 449-454 (1989); D. J. Elliott and D. C. Ferranti in "Excimer Laser Ablation of Polyimide and Copper Films in IC Packaging Applications," *Proceedings from the Second DuPont Symposium on High Density Interconnect Technology,* pp. 133-142 (1988); and U.S. Pat. No. 4,508,749.

Figure 4:
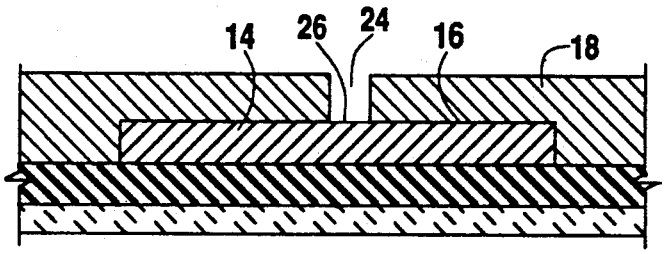
FIG. 4 is a cross-sectional view in which an opening is formed in the first polymeric dielectric layer thereby exposing a portion of the metallization.

Referring now to FIG. 4, a portion 24 beneath area 22 of first polymeric dielectric layer 18 has been photoablated, thereby exposing region 26 on the top surface 16 of conductor 14. A preferred size of exposed copper conductor 14 for forming an electrical gap is 2 μm to 20 μm. Conductor 14 can now be etched in exposed region 26 with a suitable wet or chemical etchant using first polymeric dielectric layer 18 alone as an etch mask. When the conductive layer 14 to be patterned comprises copper, ferric chloride is a desirable etchant. Thin layers of copper can be etched and removed in a ferric chloride bath by immersion for about 90 seconds at a temperature of about 40° C. Other suitable copper etchants include ammonium persulfate/phosphoric acid solutions. It is well known in the art that polymeric dielectric films are not etched or dissolved away by the usual copper etching techniques. In particular, wet chemical etching of polyimide is extremely difficult. A dry etch would be well suited for certain metals, such as aluminum or tungsten.

Figure 5:
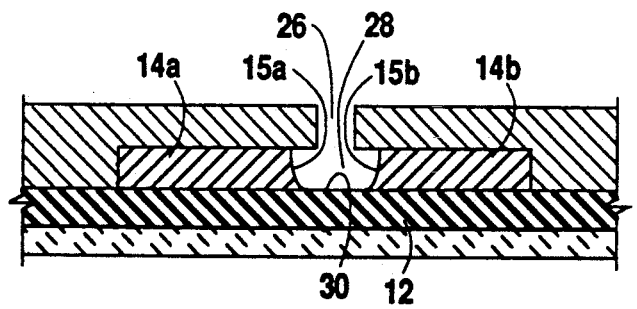
FIG. 5 is a cross-sectional view in which the exposed metallization is etched so as to disconnect the metallization.

Referring now to FIG. 5, the resulting structure is shown after etching is finished. Conductor 14 has now been disconnected into segments 14a and 14b. Etched region 28 is an open space beneath exposed region 26 extending down to the layer beneath conductor 14, shown here as optional polymeric dielectric layer 12. Conductor segments 14a and 14b are electrically disconnected from one another. A slight undercut and curvature from the conductor etch, for instance one to a few microns, may exist in the sidewalls 15a and 15b of segments 14a and 14b, respectively, adjacent etched region 28, as is common with wet copper etching processes. This undercut, however, will have no significant effect on the performance of the remaining copper structure 14. That is, segments 14a and 14b as well as the remaining first polymeric dielectric layer 18 are left intact after etching occurs.

Figure 6:
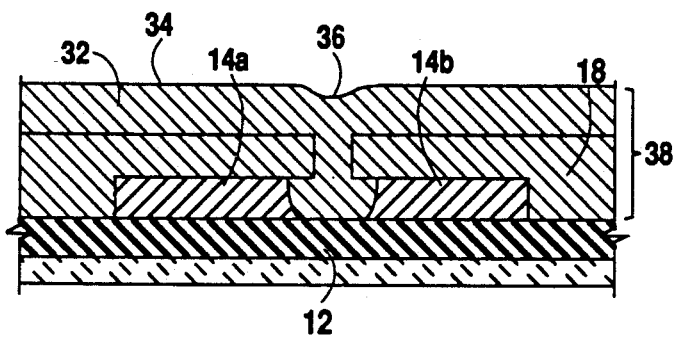
FIG. 6 is a cross-sectional view in which a second layer of polymeric dielectric is coated over the disconnected metallization and the first polymeric dielectric layer.

Referring now to FIG. 6, a second polymeric dielectric layer 32 is coated on and in contact with the remaining first polymeric dielectric layer 18 and conductor segments 14a and 14b, as well as slight steps over the outer edges of conductor segments 14a and 14b. As a result, a second composite wiring layer comprising, more preferably consisting essentially of, and most preferably consisting of conductor segments 14a and 14b, the remaining first polymeric dielectric layer 14, and the second polymeric dielectric layer 32 is formed on the entire top surface 13 of substrate 8. A preferred thickness of second polymeric dielectric layer 32 is 2 μm to 20 μm. The top surface 34 of second polymeric dielectric layer 32 will probably contain a slight recess 36 above the etched region 28 between conductor segments 14a and 14b. In the preferred embodiment, a composite polymeric dielectric layer 38 consists of optional polymeric dielectric layer 12, first polymeric dielectric layer 18, and second polymeric dielectric layer 32. Composite polymeric dielectric layer 38 completely surrounds conductor segments 14a and 14b to provide maximum dielectric protection.

Figure 7:
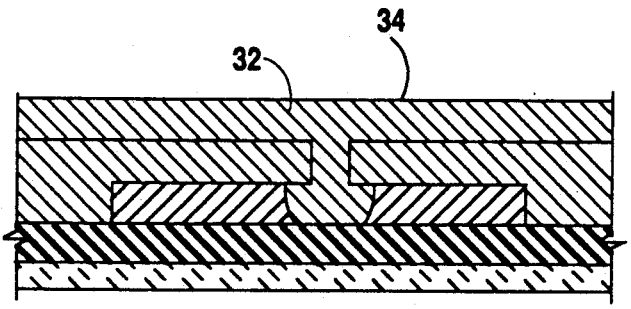
FIG. 7 is a cross-sectional view in which the top surface of the second layer of polymeric dielectric has been planarized.

Referring now to FIG. 7, top surface 34 of second polymeric dielectric layer 32 can be planarized if desired to eliminate recess 36 and any other steps. The details of polymeric dielectric polishing and planarization are well known to those having skill in the art.

Figure 8:
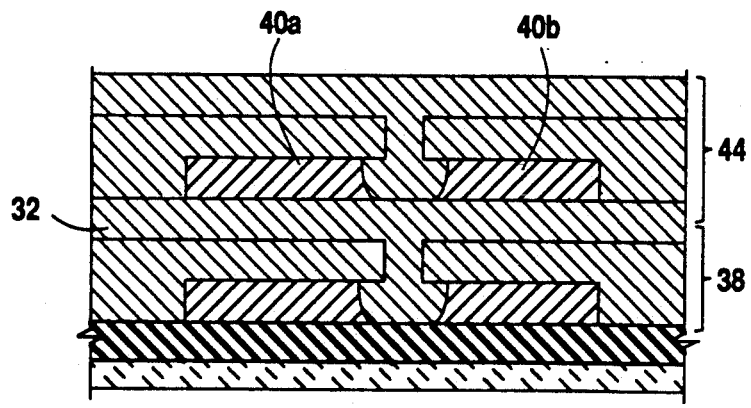
FIG. 8 is a cross-sectional view of a second interconnect metallization layer deposited on the second polymeric dielectric layer.

Referring now to FIG. 8, the above-described process can be repeated to construct a multilayer interconnect. The resulting structure will contain conductive segments 40a and 40b disposed on the underlying composite polymeric dielectric layer 38, and an additional composite polymeric dielectric layer 44 around and above conductive segments 40a and 40b. Obviously as many levels of disconnected metallization can be fabricated as desired in accordance with the present invention.

It is understood that the method of the present invention may suitably comprise, consist of, or consist essentially of the forementioned process steps.

The present invention, therefore, is well adapted to carry out the objects and attain the ends and advantages mentioned, as well as others inherent therein. While presently preferred embodiments of the invention have been described for the purpose of disclosure, numerous changes in the steps of the process will be readily apparent to those skilled in the art, and are encompassed within the spirit of the present invention and the scope of the appended claims.

What I claim is:

1. A method of disconnecting metallization in an electrical interconnect, comprising the steps of:
   providing an electrically conductive metallization on portions of a planar substrate;
   disposing a first layer of ablative photoabsorptive polymeric dielectric on and in contact with the entire top surfaces of said metallization and the substrate regions not covered by said metallization, thereby forming on the entire substrate a first composite wiring layer comprising said metallization and said first polymeric dielectric layer wherein the top surface of said first polymeric dielectric layer is exposed;
   directing a beam of laser energy having suitable wavelength and sufficient power density at said exposed top surface of said first polymeric dielectric layer so as to ablate said first polymeric dielectric layer in the irradiated areas, thereby exposing a portion of said underlying metallization through an ablated opening in said first polymeric dielectric layer;
   etching said exposed metallization using said first polymeric dielectric layer alone as an etch mask, thereby electrically disconnecting said metallization in the exposed areas while leaving the remaining first polymeric dielectric layer and disconnected metallization intact; and coating a second polymeric dielectric layer on and in contact with said remaining first polymeric dielectric layer and said disconnected metallization so as to form on the entire substrate a second composite wiring layer comprising said disconnected metallization and said remaining first and said second polymeric dielectric layers.

2. A method as recited in claim 1 wherein said metallization is selected from the group consisting of copper, aluminum, gold, and tungsten.

3. A method as recited in claim 1, further comprising the step of providing a layer of polymeric dielectric between said metallization and said substrate.

4. A method as recited in claim 1 wherein said laser is a excimer laser.

5. A method as recited in claim 1 wherein said first polymeric dielectric layer thickness is between 1 $\mu$m and 10 $\mu$m.

6. A method as recited in claim 1 wherein said etch is a wet etch.

7. A method as recited in claim 1 wherein said etch is a dry etch.

8. A method as recited in claim 1, further including the step of planarizing the top surface of said second polymeric dielectric layer.

9. A method as recited in claim 1, further including repeating the above steps so that a multilayered interconnect structure is fabricated.

10. A method as recited in claim 1, wherein the first polymeric dielectric is selected from the group consisting of siloxane-modified-polyimide, polyimide, benzocyclo-butane, and epoxy.

11. A method as recited in claim 1, wherein the first and second polymeric dielectrics are polyimide.

12. A method as recited in claim 11, wherein the metallization is copper.

13. A method as recited in claim 1, further comprising detecting a short-circuit in said metallization, and electrically disconnecting said metallization so as to eliminate said short-circuit.

14. A method as recited in claim 1, further comprising providing a customizable substrate, and electrically disconnecting said metallization so as to customize said substrate.

15. A method as recited in claim 1 wherein said first composite wiring layer consists essentially of said metallization and said first polymeric dielectric layer.

16. A method as recited in claim 1 wherein said second composite wiring layer consists essentially of said disconnected metallization and said remaining first and said second polymeric dielectric layers.

17. A method as recited in claim 16 wherein said first composite wiring layer consists essentially of said metallization and said first polymeric dielectric layer.

18. A method as recited in claim 15 wherein said first composite wiring layer consists of said metallization and said first polymeric dielectric layer.

19. A method as recited in claim 16 wherein said second composite wiring layer consists of said disconnected metallization and said remaining first and said second polymeric dielectric layers.

20. A method as recited in claim 19 wherein said first composite wiring layer consists of said metallization and said first polymeric dielectric layer.

21. A method as recited in claims 1, 15, 16, 17, 18, 19 or 20 wherein said method consists essentially of said steps.

22. A method as recited in claim 21 wherein said method consists of said steps.

23. A method of disconnecting copper in a polymeric dielectric layer of an electrical interconnect and then surrounding the disconnected copper with a composite polymeric dielectric layer so as to rework the electrical interconnect, comprising the steps of:

providing copper on portions of a planar polymeric dielectric substrate;

disposing a first thin layer of ablative photoabsorptive polymeric dielectric on and in contact with the entire top surfaces of said copper and said polymeric dielectric substrate regions not covered by said copper, thereby forming on the entire polymeric dielectric substrate a first composite wiring layer consisting essentially of said copper and said first polymeric dielectric layer wherein the top surface of said first polymeric dielectric layer is exposed;

directing an excimer laser beam having suitable wavelength and sufficient power density at said exposed top surface of said first polymeric dielectric layer so as to ablate said first polymeric dielectric layer in the irradiated areas, thereby exposing a portion of said underlying copper through an ablated opening in said first polymeric dielectric layer;

etching said exposed copper using said first polymeric dielectric layer alone as an etch mask, thereby electrically disconnecting said copper in the exposed areas while leaving the remaining first polymeric dielectric layer and disconnected copper intact; and coating a second polymeric dielectric layer on and in contact with said remaining first polymeric dielectric layer and said disconnected copper so as to form on the entire polymeric dielectric substrate a second composite wiring layer consisting essentially of said disconnected copper and said remaining first and said second polymeric dielectric layers.

* * * * *